United States Patent
Holzhauer et al.

(10) Patent No.: US 11,679,434 B2
(45) Date of Patent: *Jun. 20, 2023

(54) METHOD FOR THE PRODUCTION OF A COOLING PLATE

(71) Applicant: Holzhauer GmbH & Co. KG, Sigmaringendorf (DE)

(72) Inventors: Anton Holzhauer, Sigmaringendorf (DE); Joachim Holzhauer, Sigmaringendorf (DE)

(73) Assignee: HOLZHAUER GMBH & CO. KG, Sigmaringendorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/433,514

(22) PCT Filed: Feb. 13, 2020

(86) PCT No.: PCT/EP2020/000043
§ 371 (c)(1),
(2) Date: Aug. 24, 2021

(87) PCT Pub. No.: WO2020/173599
PCT Pub. Date: Sep. 3, 2020

(65) Prior Publication Data
US 2022/0143676 A1    May 12, 2022

(30) Foreign Application Priority Data

Feb. 26, 2019    (DE) .................. 10 2019 001 383.2

(51) Int. Cl.
*B21D 53/04*    (2006.01)
*B23P 15/26*    (2006.01)
(Continued)

(52) U.S. Cl.
CPC ............ *B21D 53/04* (2013.01); *B21C 23/183* (2013.01); *B23P 15/26* (2013.01); *F28F 3/022* (2013.01); *Y10T 29/49359* (2015.01)

(58) Field of Classification Search
CPC ......... B21D 53/04; B21D 53/02; B23P 15/26; Y10T 29/49359; B21C 23/06; B21C 23/183
See application file for complete search history.

(56) References Cited

U.S. PATENT DOCUMENTS

| | | | | |
|---|---|---|---|---|
| 6,003,586 A | * | 12/1999 | Beane | B22D 25/02 |
| | | | | 164/63 |
| 6,189,363 B1 | * | 2/2001 | Lai | B21C 23/14 |
| | | | | 72/267 |
| 8,726,505 B2 | * | 5/2014 | Flint | H01L 23/367 |
| | | | | 29/469 |
| 9,502,329 B2 | * | 11/2016 | Nagaune | H01L 23/473 |
| 9,555,505 B2 | * | 1/2017 | Kokubo | B21K 23/00 |

(Continued)

FOREIGN PATENT DOCUMENTS

| | | | | |
|---|---|---|---|---|
| DE | 19545048 A1 | * | 11/1996 | ............... C21B 7/10 |
| DE | 202008006122 U1 | * | 8/2008 | ......... F28D 15/0233 |

(Continued)

OTHER PUBLICATIONS

International Search Report issued by the European Patent Office in International Application PCT/EP2020/000043.

*Primary Examiner* — Sarang Afzali
(74) *Attorney, Agent, or Firm* — Henry M. Feiereisen LLC

(57) ABSTRACT

In a method for the production of a cooling plate from a material having thermal conductivity, a workpiece in the form of a flat material blank with uniform material thickness is placed into a tool. The workpiece is pressed in a first stage by an inner punch of the tool to form in cooperation with pin
(Continued)

forming openings of the tool pins upon an effective surface swept by the coolant, as the workpiece is held down by an outer punch of the tool, such that the pins protrude approximately perpendicular over a base area of the workpiece. In a second stage, the workpiece is pressed by the outer punch such as to form an essentially radially extending, flat peripheral edge of reduced material thickness in surrounding relation to the pins, as the workpiece with the formed pins is held down by the inner punch of the tool.

9 Claims, 12 Drawing Sheets

(51) Int. Cl.
    *B21C 23/18*     (2006.01)
    *F28F 3/02*     (2006.01)

(56) References Cited

U.S. PATENT DOCUMENTS

| | | | |
|---|---|---|---|
| 2008/0066888 A1* | 3/2008 | Tong | H01L 23/3677 |
| | | | 165/80.3 |
| 2010/0206538 A1* | 8/2010 | Chen | H01L 23/467 |
| | | | 165/185 |
| 2016/0158825 A1 | 6/2016 | Inoshita et al. | |
| 2020/0222959 A1 | 7/2020 | Holzhauer et al. | |

FOREIGN PATENT DOCUMENTS

| | | |
|---|---|---|
| DE | 10 2015 120 835 A1 | 6/2016 |
| DE | 10 2018 005 265 A1 | 1/2019 |
| EP | 3 117 953 A1 | 1/2017 |
| JP | 2012-227365 A | 11/2012 |
| WO | WO 2017/208669 A1 | 12/2017 |
| WO | WO 2019/007547 A1 | 7/2018 |
| WO | WO 2019/007547 A1 | 1/2019 |

* cited by examiner

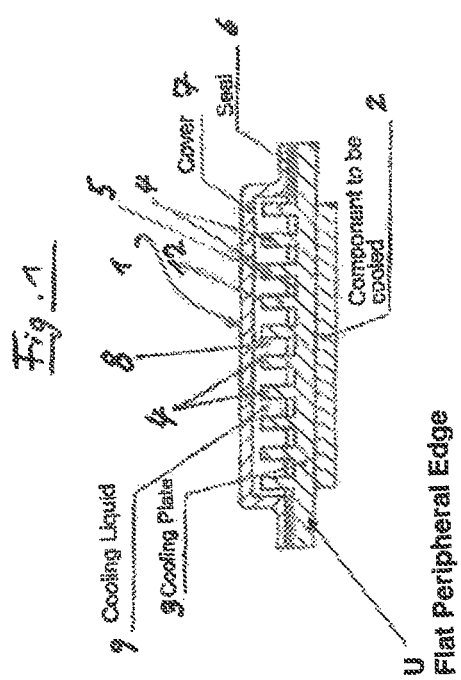

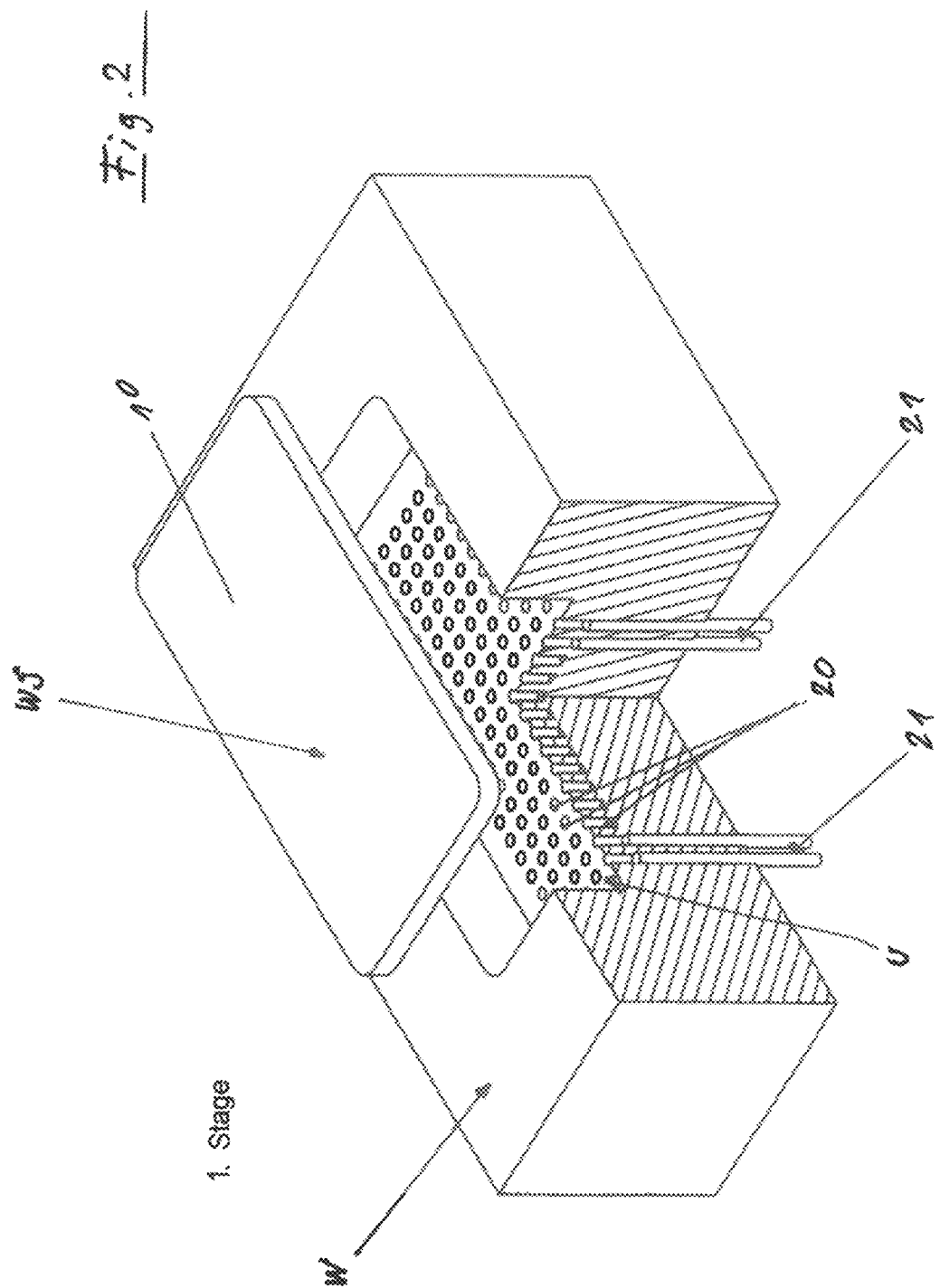

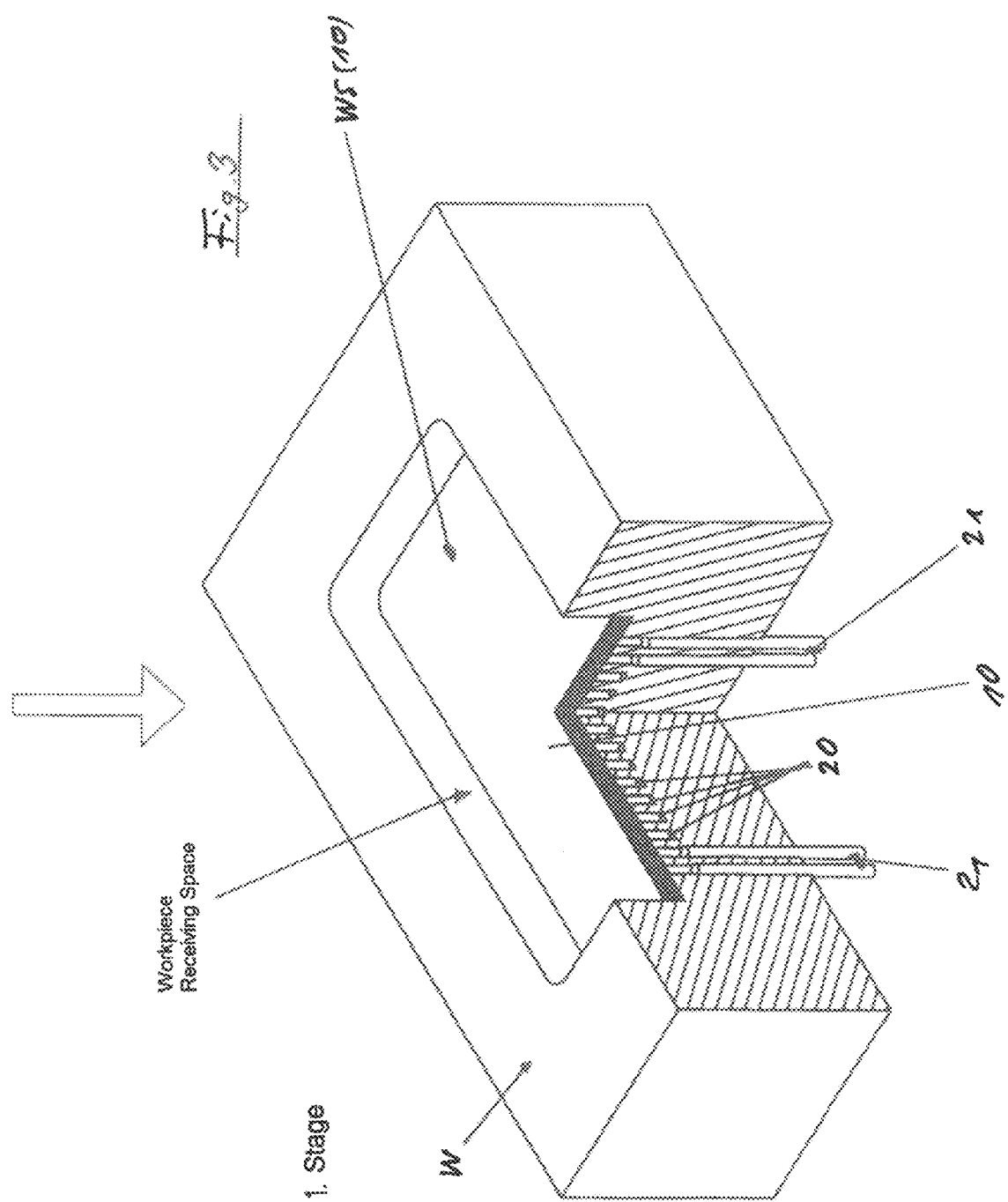

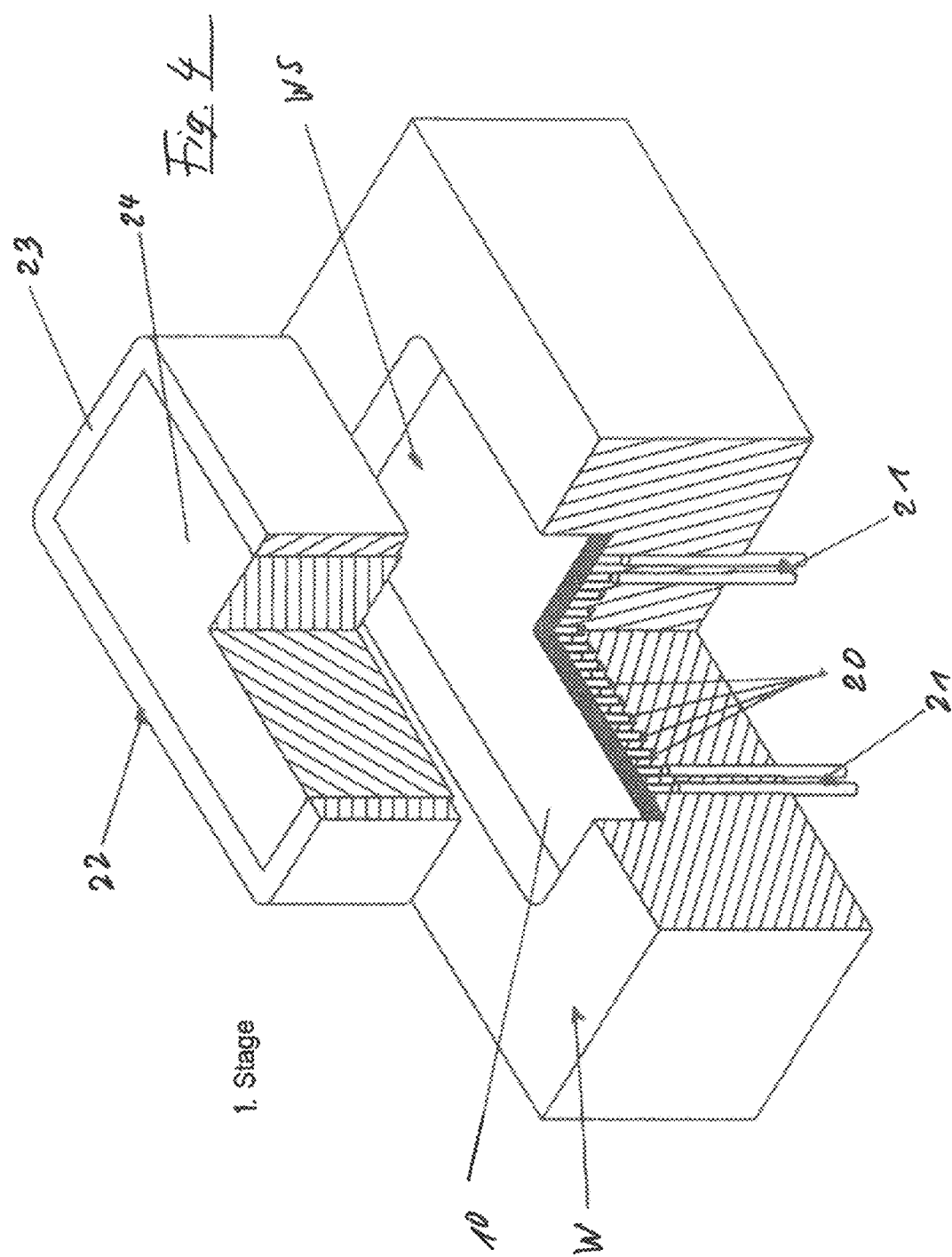

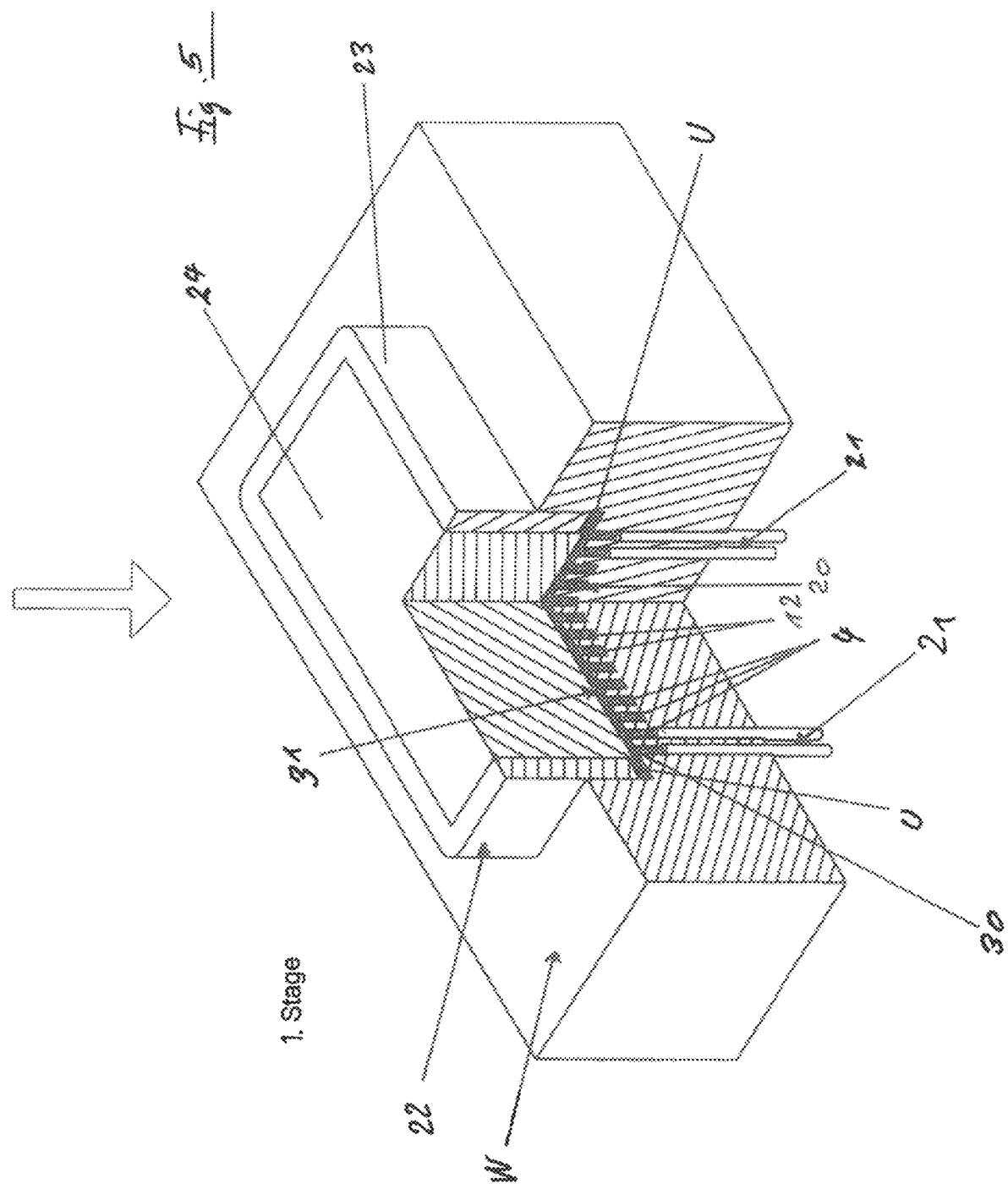

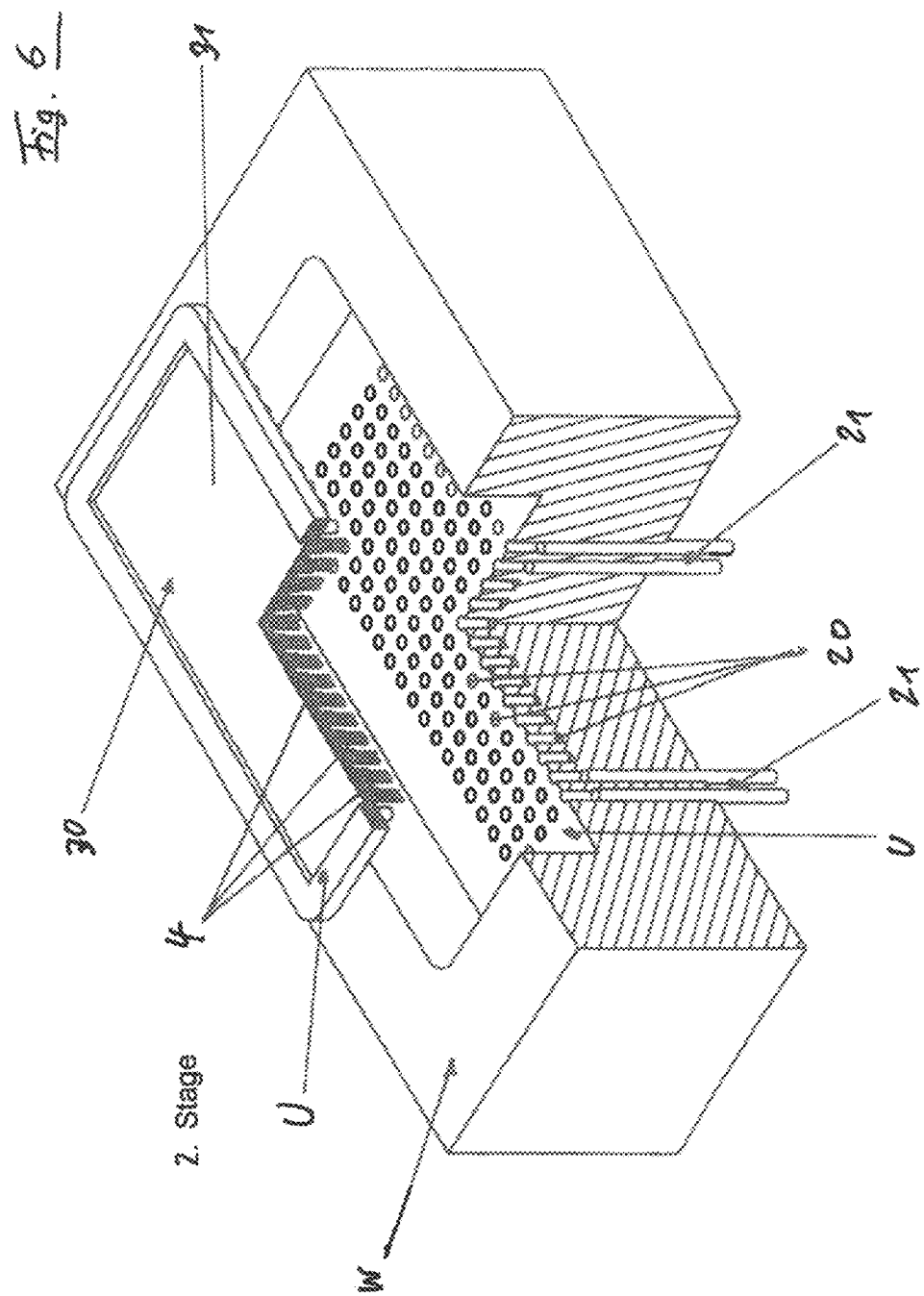

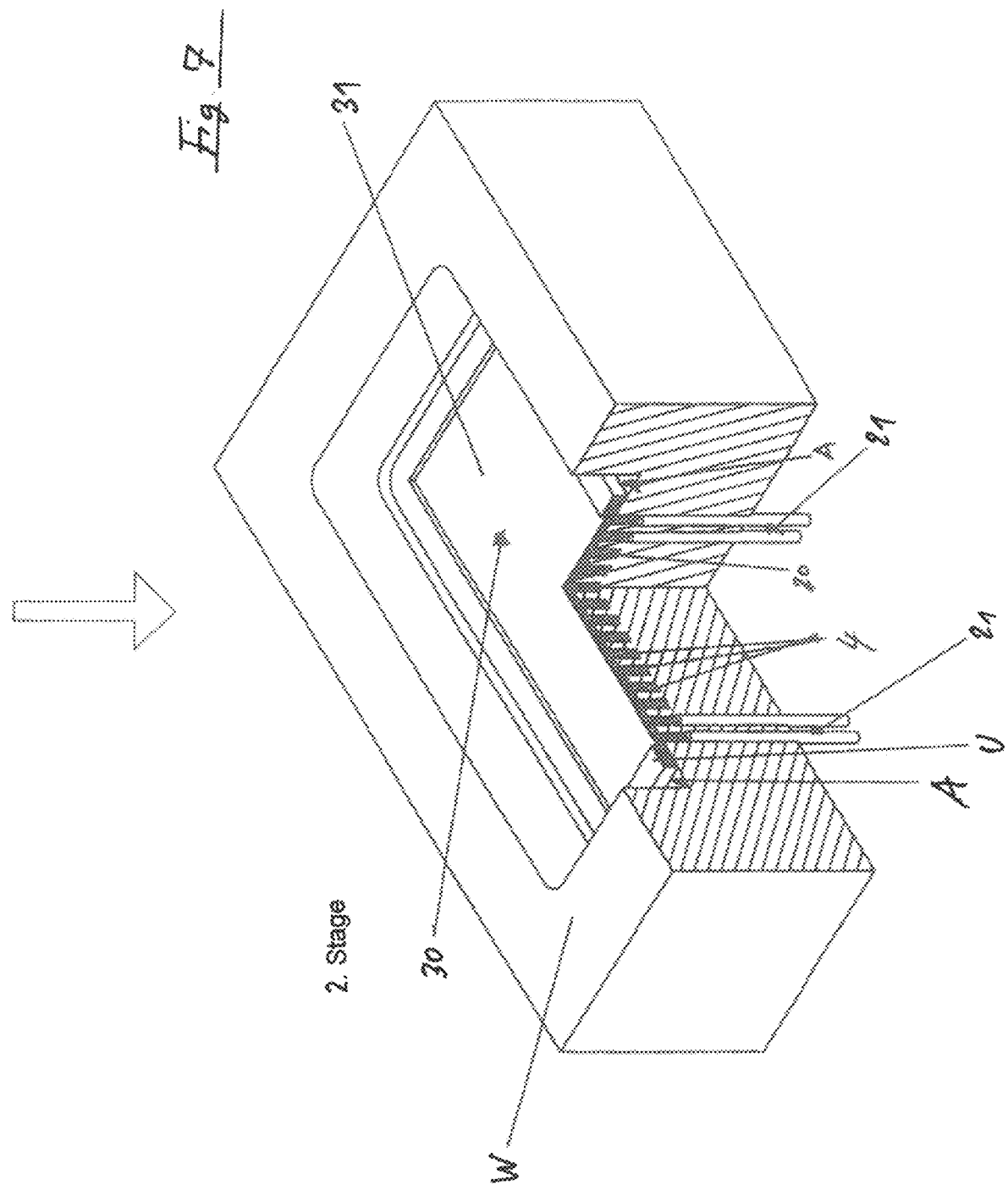

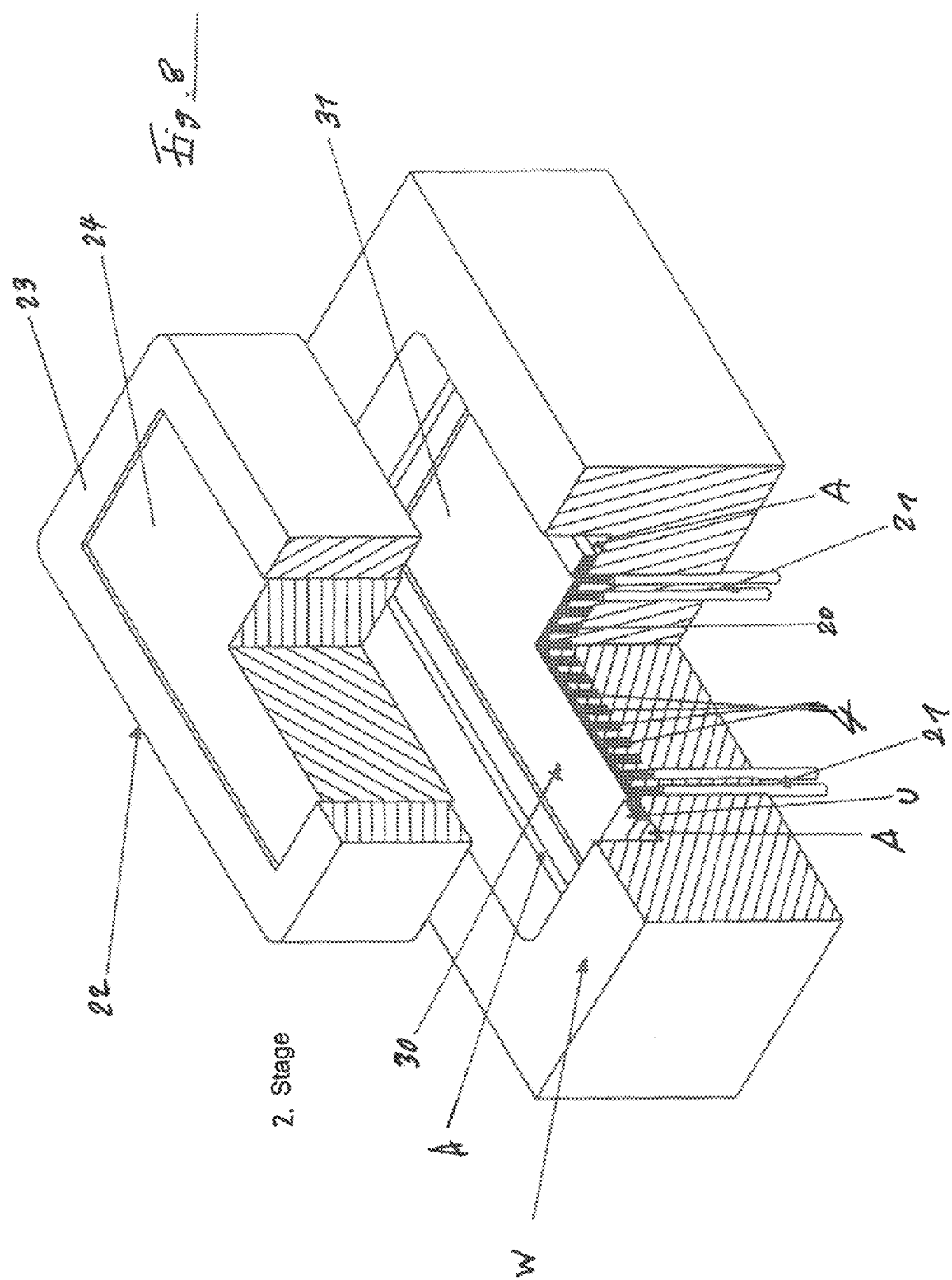

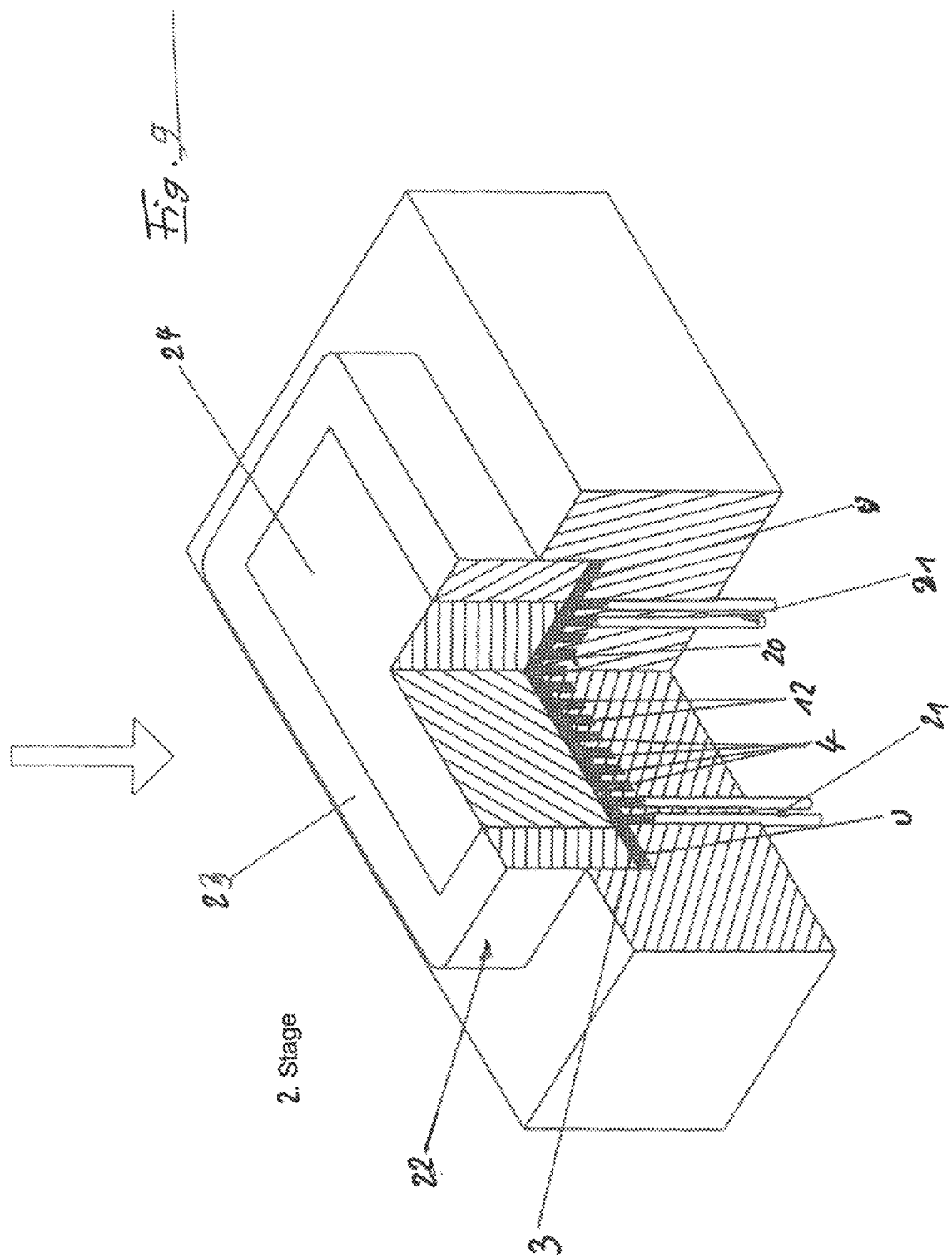

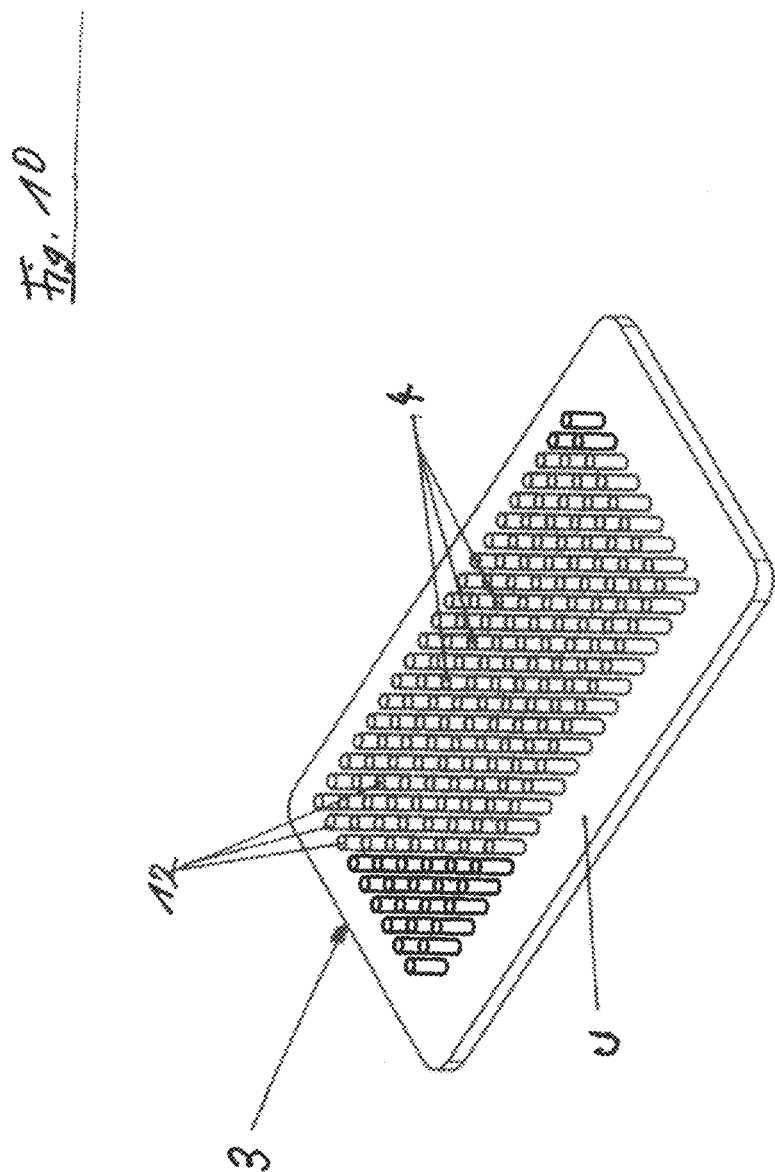

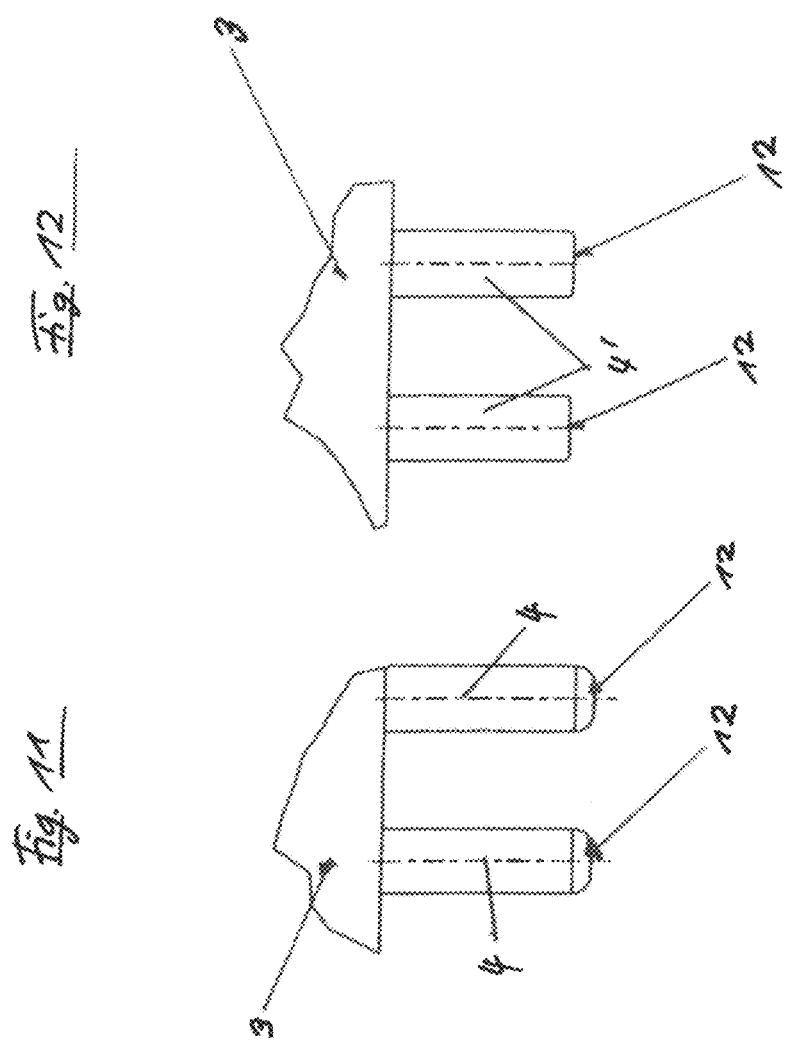

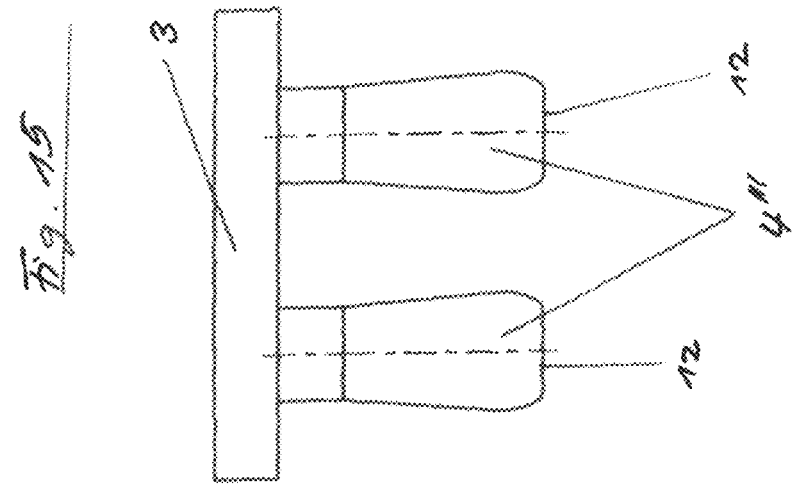
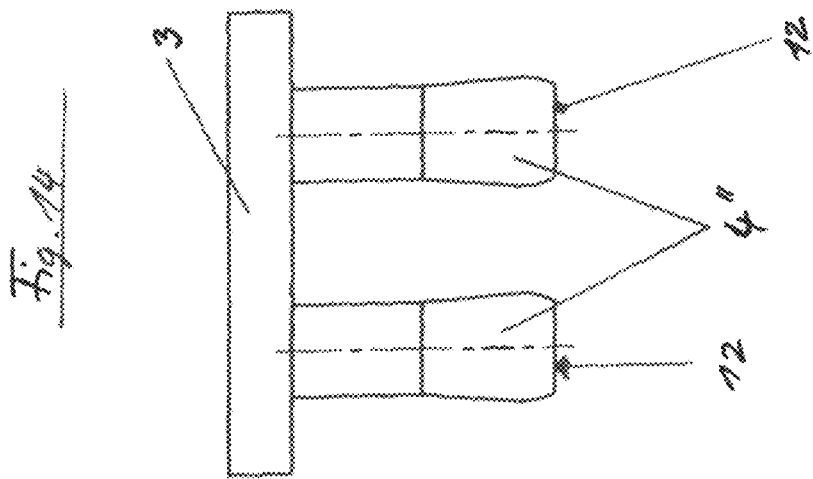
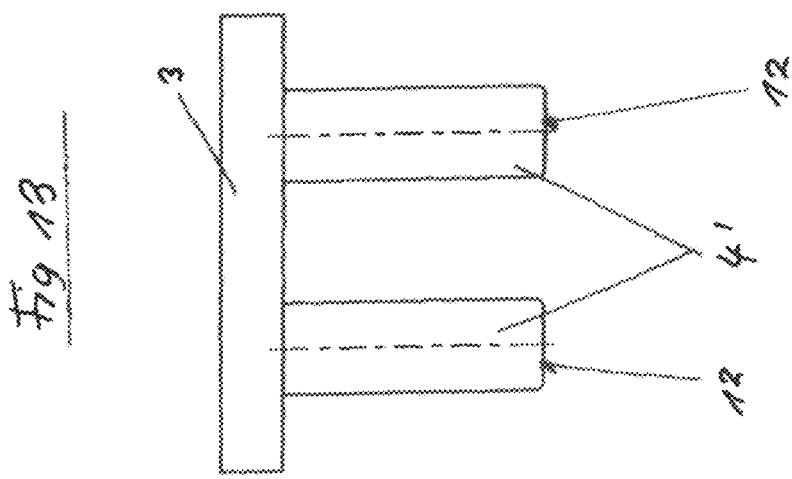

METHOD FOR THE PRODUCTION OF A COOLING PLATE

CROSS-REFERENCES TO RELATED APPLICATIONS

This application is the U.S. National Stage of International Application No. PCT/EP2020/000043, filed Feb. 12, 2020, which designated the United States and has been published as International Publication No. WO 2020/173599 A1 and which claims the priority of German Patent Application, Serial No. 10 2019 001 383.2, filed Feb. 26, 2019, persuant to 35 U.S.C. 119(a)-(d).

BACKGROUND OF THE INVENTION

The invention relates to a method for the production of a cooling plate from material with very good thermal conductivity, such as copper, aluminum, their alloy or the like, with pins protruding approximately perpendicularly over a base area on an effective surface swept by the coolant, wherein the pins are surrounded by an essentially radially extending, flat peripheral edge, wherein the cooling plate is produced in a tool by forming a workpiece.

Such cooling plates find application, for example, in battery constructions, inverters, fuel cells, heat-sensitive electrical or electronic components such as chips or the like.

Cooling plates of the generic type are typically produced by forging or machining processes that oftentimes require additional complex finishing works. To date, such cooling plates have been relatively expensive to produce and oftentimes also generate waste when processing the material with very good thermal conductivity, which is relatively expensive in terms of the initial costs.

From DE 10 2015 120 835 A1 a production method for cooling plates is known in which a flat material is processed by using rollers. This results in irregularly shaped pins, which have to be sufficiently spaced in order to create pins that are largely of same length. Furthermore, complex, in particular time-consuming finishing works are required. Therefore, a smaller pin density is obtained on the effective surface and the cooling effect is reduced.

EP 3 117 953 A1 describes a method for the production of a cooling plate from material with very good thermal conductivity, such as copper, aluminum, their alloy or the like, with pins protruding approximately perpendicularly over a base area on an effective surface swept by the coolant, wherein the pins are surrounded by an essentially radially extending, flat, functionally necessary peripheral edge, and the cooling plate is produced in a tool by forming a workpiece. The workpiece in the form of a flat material blank with a uniform material thickness is placed into the tool, which includes a punch that interacts with pin forming openings in the tool to produce the pins, with the pins being formed by the punch through pressing in cooperation with the pin forming openings of the tool.

From JP 2012 227 365 A a method for the production of a cooling plate is known in which no hold-down device is used in the area of the outer circumference of the flat material, which is why the material is not prevented from "rising", i.e. from backward extrusion along the punch, which also means that there is no flow restriction for the material in the tool.

From DE 10 2018 006 265 A1 a method for the production of a cooling plate is known in which a two-part punch is used, with an outer punch initially compressing and widening in a first stage the outer circumference of the flat material, while the pin punch acts as a hold-down device. In the second stage, the outer punch acts as a hold-down device and the pin punch extrudes the pins onto the flat material. In this case, not only are the two forming stages swapped, but rather the same lower tool can be used in both forming stages.

The invention aims and is based on the object to provide a method for the production of a cooling plate of the generic type, which can be realized inexpensively, is material-saving and resource-saving and has an extremely effective cooling action with high pin density on the effective surface.

SUMMARY OF THE INVENTION

The object is achieved with a method for the production of a cooling plate from material with very good thermal conductivity, such as copper, aluminum, their alloy or the like, with pins protruding approximately perpendicularly over a base area on an effective surface swept by the coolant, with the pins being surrounded by an essentially radially extending, flat, functionally necessary peripheral edge, and the cooling plate being produced in a tool by forming a workpiece, which is characterized in that the workpiece is placed in the form of a flat material blank with uniform material thickness in the tool, which includes at least an outer punch (peripheral edge punch) for generating the essentially flat peripheral edge and an inner punch (pin punch) which cooperates with pin forming openings in the tool for generating the pins, that the pins are formed in a first stage by the pin punch through pressing in cooperation with the pin forming openings of the tool, as the workpiece is held down by the outer punch, and that in a second stage the peripheral edge is formed by the outer punch with reduced material thickness through pressing as the workpiece with the formed pins is held down by the inner punch of the tool.

The invention thus uses a cost-effective cold pressing or compressing with preceding heating, with the formation of the pins on the coolant-swept effective surface using the material of the flat material blank or the insert part directly by forming on one hand, so that in the production according to the invention essentially there is no material loss or waste of material, as a material-saving and resource-saving production method is involved. In a first stage of the method, the pins are first formed in the central area through pressing by means of the inner punch (pin punch) in cooperation with the pin forming openings in the tool, with the outer punch holding down the flat material blank. This creates a material depression in the area of the formed pins, and the peripheral edge assigned to the outer punch is not formed on the flat material blank.

In a second step, which optionally is carried out in a further tool, the peripheral material overhang is then formed with reduced material thickness through pressing with the outer punch, as the workpiece is held down by the inner punch of the tool with the formed pins, so that an essentially flat, functionally necessary peripheral edge is realized hereby, which transitions essentially flush into the material depression zone after the phis have been formed. It is hereby of advantage that a kind of self-alignment of the flat material blank or of the insert in the tool takes place in both steps. In the first method step, the alignment is established by the full peripheral enclosure of the workpiece receiving space of the tool while the flat material blank is inserted, and in the second method step, alignment is established by the formed pins in the pin forming openings in the tool, when the peripheral edge is held down and formed with the aid of the outer punch.

A further advantage could result from the fact that the pressing forces in the second method step are significantly lower than in the first method step, so that a press that is not as powerful as that used for forming the pins may, optionally, be used for this purpose. As a result, adapted forming machines can be used that are matched to the required pressing forces. This can result in lower operating costs and processing costs.

By using an ejection device, at least some of the pin forming openings of the tool adjacent to the peripheral edge can be closed before and offset by a row of pins during forming.

In the method according to the invention, the pins are preferably calibrated starting from their free ends. When calibrating, the free ends of the pins are either pressed flatly or upset. Further, when calibrating the pins, a counter-conical configuration can also be produced, when, starting from the free ends of the pins, a calibration is carried out in such a way that the diameter of the pins decreases starting from the free end in direction of the foot area.

As an alternative, a conical configuration may also be provided through the calibration, when, starting from the free ends of the pins, a calibration is carried out in such a way that the diameter of the pins increases starting from the free ends in direction of the foot area.

Suitably, the flat material blank has a tetragonal configuration. In particular, a rectangular flat material blank may be involved.

The flat material blank is preferably formed from rolled or pressed material, in particular from rolled copper.

In summary, it is essential in the method according to the invention that the cooling plates with the pins are produced exclusively by a forming process.

BRIEF DESCRIPTION OF THE DRAWINGS

Further details, features and advantages of the invention will become apparent from the following description of preferred exemplary embodiments without limiting character, with reference to the accompanying drawings. It is shown in:

FIG. 1 a schematic sectional view of an application example of a cooling plate according to the invention;

FIGS. 2 to 10 schematic perspective partial sectional views for elucidation of the method sequence in the production method of a cooling plate according to the invention;

FIG. 11 and FIG. 12 enlarged details of individual pins of the cooling plate shown in FIG. 10, and FIGS. 13 to 15 finally show schematically further examples of configurations of the pins.

DETAILED DESCRIPTION OF PREFERRED EMBODIMENTS

Identical or similar parts are provided with the same reference signs in the figures of the drawing.

FIG. 1 shows an application example for a cooling arrangement generally designated with 1. A cooling plate 3 with the surface opposite the pins is attached to a component 2 to be cooled, such as an electrical or electronic component. As shown, the cooling plate 3 includes pins 4 on an effective surface 5 which is swept by coolant. In the shown example, a cover 7 is connected in a fluid-tight manner via a seal 6 to the substantially radially extending, flat peripheral edge U, which surrounds the pins 4, in such a way that between the cover 7 and the pins 4 of the cooling plate 3 an intermediate space 8 is formed through which a coolant 9, such as cooling liquid or cooling fluid, flows.

The method sequence according to the invention for the production of a cooling plate from material with very good thermal conductivity is explained in greater detail with reference to FIGS. 2 to 10.

FIG. 2 illustrates schematically by way of a partial sectional view a tool W, which has a bottom with many forming openings 20. At least some of the forming openings 20 adjacent to the peripheral edge U are closed by an ejection device 21. Indicated schematically at a distance to the tool W is a workpiece WS in the form of a flat material blank as raw part 10 or insert part. This workpiece WS has a uniform or same material thickness in FIG. 2.

As can be seen from FIG. 3, the workpiece WS or the flat material blank 10 or the insert part is placed in the tool W resting on the bottom thereof and is enclosed over its entire circumference in the tool W. This is the initial state for the forming process in the first stage.

In FIG. 4 shows schematically a partial sectional view of a punch assembly used for forming process in the first stage and generally designated with 22. The punch assembly 22 includes at least one outer punch or peripheral edge punch 23 and an inner punch or pin punch 24.

As indicated by arrow in FIG. 5, the punch assembly 22 is moved onto the flat material blank 10 such that the pins 4 are formed in the first stage in cooperation with the pin forming openings 20 through pressing by the inner punch, as the workpiece WS or 10 is held down by the outer punch 23.

As is apparent from FIG. 5 in conjunction with FIG. 6, the component 30, obtained at the conclusion of the first processing stage or first forming stage, has a trough-shaped recess 31 in the area of the pins 4 formed by the inner punch 24 in cooperation with the forming openings 20.

Starting from this component 30 obtained at the conclusion of the first processing stage, the component is arranged in FIG. 6 for the forming process in the second stage in the tool W in such a way that the pins 4 protrude into the associated pin forming openings 20, thereby centering the component 30 as it is placed in the tool W.

As is apparent from FIG. 7, the component 30 is arranged in the tool W in such a way that a predetermined distance A is maintained in peripheral direction between lateral peripheral boundaries of the tool W and the outer circumference of the component 30.

As can be seen from all of FIGS. 2 to 10 of the drawing, parts of an ejection device 21 preferably close at least some of the pin forming openings 20 adjacent to the peripheral edge U. This can effectively prevent material of the component 30 from also migrating into the forming opening 20 during the pressing process for forming the peripheral edge U.

FIGS. 6 to 9 are provided to explain the second processing forming stage.

As can be seen from FIG. 8, the punch assembly 22 includes at least the outer punch or peripheral edge punch 23 and the inner punch or pin punch 24. According to FIGS. 8 and 9, as the component 30 is held down by the inner punch 24, the area of the peripheral edge U is pressed down in the second stage by the outer punch or peripheral edge punch 23 in such a way that the area with the formed pins 4 extends flush with the peripheral edge or merges into this. Thus, a substantially radially extending, flat peripheral edge is obtained, which can then, if necessary, effectively cooperate with a seal.

After processing in the second stage, a cooling plate 3 is then obtained, which is shown schematically by way of a perspective view in FIG. 10 and which has pins 4 lying very close to one another on the effective surface 5. The peripheral edge U surrounds the pins 4 and forms a common base area with the foot region of the pins 4.

FIG. 11 shows a schematic enlarged illustration of two pins which are formed, as shown in FIGS. 2 to 5 as well as FIGS. 6 and 10, by the inner punch 24 during a pressing process in cooperation with the pin forming openings 20. FIG. 12 illustrates the cooling plate 3 with the pins 4' after a calibration. As can be seen from FIGS. 11 and 12, the pins 4, 4', after being formed during the forming process in the 1 stage according to FIG. 5, have free ends 12, which are slightly curved outwards. During the calibration according to FIG. 12, these free ends 12 have been pressed flatly or may also be upset.

Finally, further exemplary configurations of embodiments of the pins 4 are shown schematically with reference to FIGS. 13 to 15.

FIG. 13 shows cylindrically designed pins 4'. FIG. 14 illustrates by way of example a counter-conical configuration of pins 4" which, however, only extends over approximately half the height of the respective pin 4". With such a counter-conical configuration, starting from the free ends of the pins 4", a calibration is implemented in such a way that the diameter of the pins 4" decreases starting from the free end 12 in direction of the foot area.

An example of such a counter-conical configuration of pins 4''' is also illustrated in FIG. 15. The counter-conical configuration extends almost to the foot area of the pins 4'''. Alternatively, the pins 4 can be configured to be conical or partially conical as a whole. This is realized with the aid of a corresponding calibration process. In such a case, starting from the free ends 12 of the pins 4, calibration is implemented in such a way that the diameter of the pins 4 increases starting from the free end 12 in direction of the foot area.

The invention is, of course, not limited to the depicted exemplary configurations, but numerous changes and modifications are possible which the artisan will make if necessary, without departing from the spirit of the invention. In particular, the pins 4, 4', 4", 4''' can also have configurations that deviate through calibration from the depicted exemplary configurations, depending on the respective field of application, or also include combinations of the exemplary configurations shown in FIGS. 11 to 15. Although a rectangular flat material blank 10 is assumed in the illustrated examples, this can of course also be designed generally tetragonal or oval or the like and it may also involve a flat material blank of square shape.

The flat material blank can preferably be formed from roiled or pressed material, in particular from rolled copper. This involves a material with very good thermal conductivity.

LIST OF REFERENCE SIGNS 1 cooling assembly overall
2 component to be cooled
3 cooling plate
4 pins in FIG. 11
4' pins in FIGS. 12+13
4" pins in FIG. 14
4''' pins in FIG. 15
5 effective surface
6 seal
7 lid
8 intermediate space
9 coolant
10 flat material blank as raw part or workpiece WS
12 free end of pin 4
20 pin forming openings
21 ejection device
22 punch assembly overall
23 outer punch
24 inner punch
30 component processed in the first stage by forming
31 trough-shaped recess in the area of the pins 4
A distance
U peripheral edge
W tool
WS workpiece

What is claimed is:

1. A method for the production of a cooling plate from a material having thermal conductivity, said method comprising:
    placing a workpiece in a form of a flat material blank with uniform material thickness into a tool;
    pressing, as a peripheral edge of the workpiece is held down by an outer punch of the tool, the workpiece in a first stage by an inner punch of the tool to form, in cooperation with pin forming openings of the tool, pins upon an effective surface swept by a coolant, such that the pins protrude perpendicular over a base area of the workpiece, thereby creating a material depression zone in the base area of the workpiece; and
    pressing, as the workpiece with the formed pins is held down by the inner punch of the tool, the peripheral edge of the workpiece in a second stage by the outer punch such as to form a radially extending, flat peripheral edge of reduced material thickness in surrounding relation to the pins, which transitions flush into the material depression zone after the pins have been formed, wherein the flat material blank is copper, aluminum, or an alloy thereof.

2. The method of claim 1, further comprising calibrating the pins starting from free ends of the pins.

3. The method of claim 2, wherein the free ends of the pins are pressed flat or upset during calibration.

4. The method of claim 1, wherein during calibration a diameter of the pins decreases starting from the free ends in a direction of a foot area.

5. The method of claim 1, wherein during calibration a diameter of the pins increases starting from the free ends in a direction of a foot area.

6. The method of claim 1, wherein the flat material blank has a tetragonal configuration.

7. The method of claim 1, wherein the flat material blank has a rectangular configuration.

8. The method of claim 1, further comprising forming the flat material blank from rolled or pressed material.

9. The method of claim 1, further comprising forming the flat material blank from rolled copper.

* * * * *